INVENTOR
Wolf Guttmann

BY Thomas A. Harwood
ATTORNEY

INVENTOR
Wolf Guttmann
BY Thomas A. Harwood
ATTORNEY

United States Patent Office 3,429,980

Patented Feb. 25, 1969

3,429,980

ELECTRONIC COMPONENT PACKAGE AND COVER

Wolf Guttmann, 711 W. 7th St., Austin, Tex. 78701

Filed Feb. 17, 1966, Ser. No. 528,186

U.S. Cl. 174—52 4 Claims

Int. Cl. H05k 5/00, 5/03; B65d 43/10

ABSTRACT OF THE DISCLOSURE

A resilient protective cover for enclosing a module of a circuit. The cover snaps onto the top of a pin-type tube plug. A plurality of interior surface portions are provided on the cover which engage the surfaces of the plug.

This invention relates generally to an electronic component package, and more specifically to a protective cover for electronic components. Yet more particularly, it relates to a resilient, protective cover adapted to be fitted over the top of a standard or conventional pin-type vacuum tube plug to form a seal thereabout for the enclosure and protection of electronic components connected to the solder pins of the plug and enclosed within the cover.

Conventional packaging, mounting and enclosure of electronic circuits is often unsuitable for use in some environments to which the electronic circuitry is applied. As one example only, the use of electronic circuitry in some laboratories and industrial facilities poses the problem of suitably protecting the electronic circuitry from the surrounding environment. In the chemical industry, for example, automation and control circuitry is often required to be used in an environment which contains moisture, dust, corrosive fumes and a host of other elements that have an adverse effect on conventionally encapsulated electronic components and circuits. One of the major problems incurred in the use of conventional electronic circuitry in such an environment is the repair of the circuitry at the particular location used. This is especially true when the environment contains corrosive fumes and moisture which collects in the circuitry, so that it is virtually impossible to conduct repair work such as soldering and replacements of parts without creating a danger for the repairman and wherein the cleanliness of the circuit during repairing operations is important. This type of environment is also conducive to creating electrical shorts and malfunctions in the circuits.

The solution to this general problem is actually twofold. A first aspect is the necessity for providing suitable protective covering for the electronic circuitry so that it is not subject to the detrimental environment in which it operates. A second aspect is the repair of the circuitry either on location, or alternatively, the provision of self-contained electronic units or modules which can readily be disconnected or unplugged and removed from the environment for repair. Should the circuitry be repaired on location, a suitable protecting cover will protect the electronic components from the environment so that it is in suitable condition for repair. By providing not only a suitable protective covering but one which also encloses a complete electronic module that can readily be removed from the rest of the circuit, the further advantage is achieved by allowing the maintenance on the circuitry to be conducted elsewhere. Thus it is an object of this invention to provide a suitable protective covering for electronic circuitry that is adapted to be used in the general type of environment mentioned. It is still a further object of the invention to provide a suitable protective covering for encapsulating complete and entire modules of circuits that may readily be removed or unplugged from the rest of the circuitry. The provision of the latter not only allows the circuitry to be repaired elsewhere but allows the immediate replacement of an entire module upon failure thereof so that there is no substantial loss of time incurred in this event.

Although the solution to these general problems has previously been undertaken, most of the protective coverings hereinbefore provided require a completely revised scheme of mounting the electronic circuitry, in addition to which the protective coverings are elaborate and hard to assemble the electronic circuitry therewithin. This is especially true for those protective coverings which are designed for an entire and complete module that may readily be plugged and unplugged from a larger circuit. The main objection to these previous approaches is the elaborate nature thereof and the cost incurred in the provision of special components to assemble the module. It is therefore another object of the invention to provide a protective covering for encapsulating an entire module of a circuit that may readily be plugged and unplugged from a larger circuit, wherein the structure of the protective covering is greatly simplified and requires an absolute minimum of effort and trouble to enclose the electronic components therewithin. In particular, it is a more specific object to provide such a protective covering that is adapted to be used with a conventional circuit mounting, and yet more particularly, to be used with a conventional pin-type tube plug and socket which is readily available on the market in quantity at a very low price.

In accordance with the above-stated objects, the present invention provides a very simplified protective cover that can readily be snapped onto the top of a conventional pin-type tube plug, wherein electronic components can be mounted on the top of the plug, connected to the soldering pins thereof and encapsulated within the protective covering. To provide the necessary protection for the components contained therewithin, the invention provides a resilient cover which is impervious to corrosive fumes, moisture and the like, such as comprised of a suitable plastic or semi-rigid insulating material. The protective cover defines a circular opening in the bottom thereof of the same general diameter as that of a corresponding conventional pin-type tube plug, so that the cover fits around the outside diameter of the plug. There are also suitable flanges and shoulders defined about the inner circumference of the opening to correspond to the various flanges and shoulders of the tube plug, whereby the resilient cover is snapped onto the top of the plug with a flange of the cover forming a seal about a reduced diameter, intermediate section of the plug. Thus when snapped onto the tube socket with the cover flange forming a tight seal about the intermediate section of the socket, the electronic components contained therewithin are sealed off from the environment. In one embodiment of the invention, a cylindrical cover is provided which is closed on the top and defines a circular opening in the bottom thereof having a suitable flange defined about the circumference of the opening for being snapped onto the conventional tube plug. In another embodiment of the invention, a cover is provided having a rectangular cross section which is closed on one end and open on the other end. In conjunction therewith, there is provided a bottom plate or floor for the rectangular package which can be sealed by any suitable manner over the opening therein, which lid defines a circular opening with a suitable flange for being snapped onto a conventional tube plug. In the first embodiment, electronic components are mounted on top of the tube plug and are connected through the plug to the solder pins according to the proper electrical schematic. The cover is then snapped onto the plug over the components, resulting in a self-contained electrical module that may readily be plugged in and out of a conventional tube socket contained in a larger circuit and which provides the necessary protective covering. In the second embodiment, which is adapted for use with electrical modules including more and larger components, a circuit or mounting board may be installed within the dectangular cover prior to sealing the lid into place, with suitable wires from the board being connected to the solder pins of a conventional tube plug, so that when the plug is snapped into place within the circular opening of the lid, a complete and entire electrical module is provided that can readily be plugged into a conventional tube socket.

There are other objects, features and advantages that will become readily apparent from the following detailed description of the invention when taken in conjunction with the appended claims and the attached drawing wherein like reference numerals refer to like parts throughout the several figures, and in which:

Figure 4:
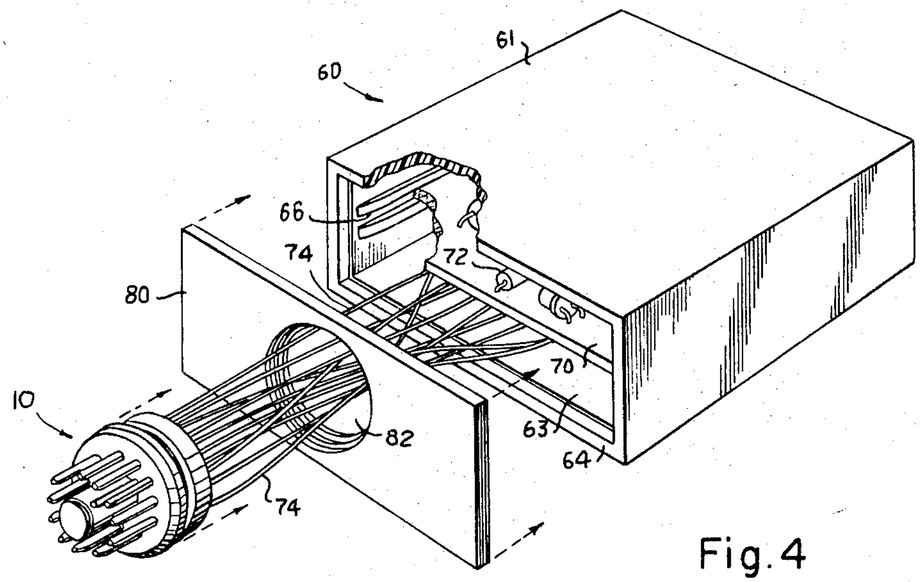
Figure 5:
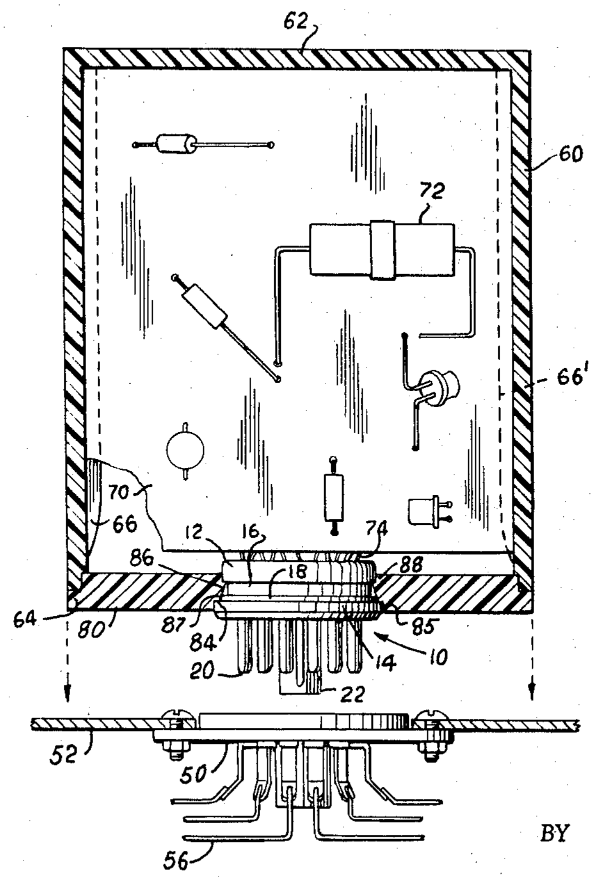

FIGURE 4 is an expanded, perspective view, partly cut away, of another embodiment of the invention which comprises a rectangular cover and a floor plate for use therewith, the latter of which defines a circular hole in the bottom for being fitted onto a conventional tube plug; and FIGURE 5 is a side elevational view, partly in section, of the embodiment shown in FIGURE 4 with the cover and floor plate shown assembled to the tube plug.

Figure 1:
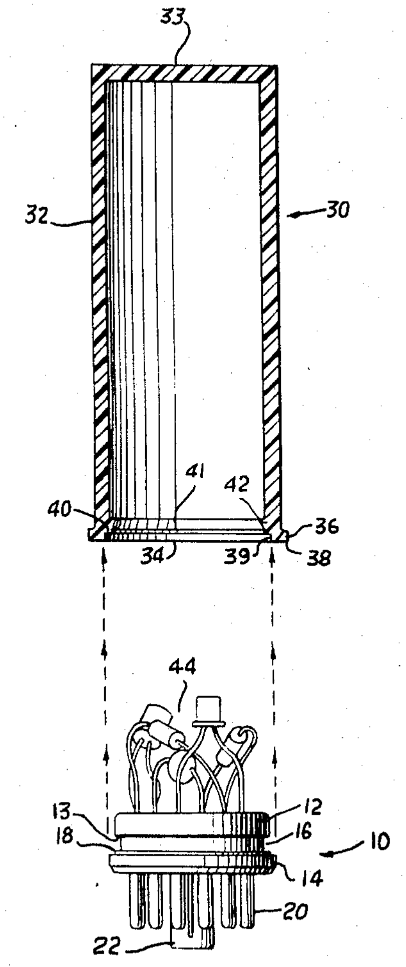
FIGURE 1 is a side elevational view, partly in section, of one protective cover provided by the present invention, including a conventional pin-type tube plug with electronic components mounted thereon for use therewith.

A conventional pin-type tube plug is shown and denoted generally as numeral 10 in FIGURE 1 and has a generally circular cross section. The plug includes a top portion or section 12, a base portion or section 14 of larger diameter than the top portion and an intermediate and integrally connecting section 16 of diameter less than the diameter of the top portion. Conventional pin-type plugs of this nature are usually constructed with a narrow annular shoulder 18 disposed between the base 14 and the intermediate section 16, which annular shoulder has a diameter about equal to the top portion 12. The plug also includes solder pins 20 which form an integral part therewith and communicate with corresponding holes passing through the plug and opening in the top surface. A guide 22 disposed at the center of the plug and projecting from the bottom thereof is provided for guiding the plug into a conventional tube socket, all of which is well known.

The invention provides a cover, designated generally at numeral 30, for use with a conventional plug, which cover comprises a cylindrical or tubular member having a wall 32 and enclosed at the top 33 as shown. The cover is open at the bottom end 34 for being snapped onto and over plug 10. The cover comprises a single, unitary member made of a suitably resilient material, such as plastic or any other suitable semi-rigid, insulating material, which is impervious to corrosive fumes, moisture and other environmental conditions. The cover is sufficient rigid, however, to function as a structural member. Semi-rigid polyvinyl chloride is one example only of a suitable material for this purpose and can be cast or molded to any desired shape. Defined about the periphery of the bottom end of the cover is an annular shoulder or flange 36 of slightly greater outside diameter than the cover proper, which shoulder defines a flat, annular surface 38 at the bottom thereof. Another annular surface 40 is defined within the interior of shoulder 36 about the inner circumference thereof and is recessed from the bottom surface by an annular wall section or interior surface portion 39. Another annular shoulder or flange 42 is defined a small distance above surface 40 and separated therefrom by wall interior surface portion 41 of the same diameter as the inner diameter of the cover proper. As shown in cross section, flange 42 defines an annular, beveled surface extending inward to a diameter slightly less than the inside diameter of the cover proper.

Figure 2:
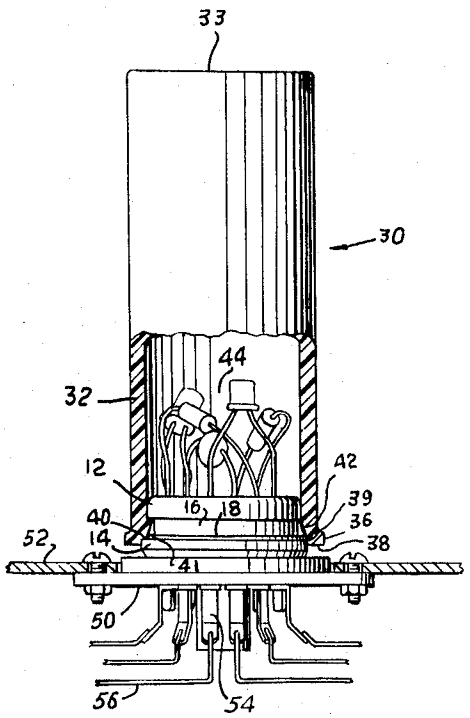
FIGURE 2 is a side elevational view, partly in section, of the cover and plug shown in FIGURE 1 with the protective cover snapped onto the plug to provide a protected, self-contained circuit module.
Figure 3:
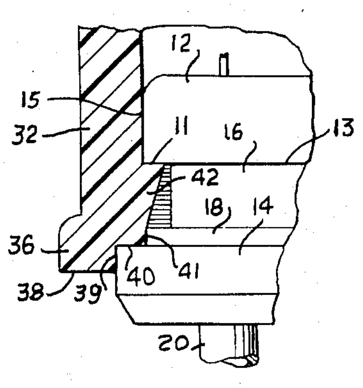
FIGURE 3 is an enlarged view, partly in section, of a fragment of the embodiment shown in FIGURE 2 showing more clearly the various flanges and shoulders of the cover opening and plug and the seal formed therebetween.

To form a complete and entire module of electronic circuitry which may be plugged in and out of a conventional tube socket contained within a larger circuit for immediate replacement of the module when a malfunction occurs, suitable electronic components 44 required to comprise a circuit module are connected according to the desired electrical schematic diagram into the plug by inserting the leads of the components into the soldering pins 20 and forming the solder connection. After all of the components have been mounted accordingly, the cover 30 is pushed down over the top portion 12 of the plug as shown in FIGURE 2 until surface 40 comes to rest on the flat annular top surface of base 14. All of this is more clearly shown in the enlarged, fragmentary view of FIGURE 3, whereby the interrelations between the cover and plug flanges will become more apparent. As shown in this view, beveled flange 42 has been urged over the top portion 12 of the plug and deflected accordingly so that it is positioned in correspondence with intermediate section 16 of the plug. It is not important that flange 42 bear against the intermediate section 16 of the plug, which it does not as shown in FIGURE 3, but only that this flange provides a lip surface 11 under the bottom surface 13 of top section 12. As noted earlier, the upward movement of the plug into the cover is limited by surface 40 bearing against the top surface of bottom section 14 of the plug. As is apparent from this figure, the inner wall surface portion 15 of the cover proper bears against the sides of top section 12 to form a seal therewith. Similarly, interior wall surface portion 41 below flange 42 bears agaianst shoulder 18 of the plug, and annular wall interior surface portion 39 bears against the sides of bottom section 14 of the plug, all of which contributes to forming a tight seal between the cover and the plug.

The dimensions of the cover and plug have been drawn to actual size for one particular conventional plug and cover, whereby opening 34 and the various shoulders and flanges and interior surface portions of the cover are such that when snapped into place over the plug, the dimensions are proper to form a seal therewith.

This unit can now be plugged directly into a conventional tube socket 50 which is mounted on a circuit board 52, all as shown in FIGURE 2. As is obvious, the solder pins of the plug contact corresponding solder terminals 54 of the socket, so that wires 56 can be soldered to these terminals for connection with other circuitry. The advantage of this greatly simplified structure and protective cover will now be readily apparent, since the cover is easy and inexpensive to manufacture and is adapted for use with conventional pin-type plugs that are readily available on the market in quantity at a low cost. It will also be noted that the electronic components housed therewithin are completely sealed off from the environment, since the solder pins projecting from the bottom of the plug are closed off and a complete seal is provided between the cover and the plug.

Another embodiment of the invention is shown in the expanded, perspective view of FIGURE 4, which embodiment also utilizes the concept of the resilient, flanged and shouldered opening adapted for use with the conventional pin-type plug. This particular embodiment of the invention comprises a housing of rectangular cross section, designated generally at numeral 60, which is closed on the top end and manufactured of the same or similar material as described with reference to cover 30. This particular cover has a wall 61 and an enclosed top 62 (shown in FIGURE 5) and defines an opening 63 of rectangular cross section in the bottom thereof. A flat surface 64 of the same width as the wall defines the circumference of opening 63. This particular cover is adapted to support and enclose larger circuits than that used in the embodiment shown in FIGURES 1–3, whereby such circuits comprised of electronic components 72 can be mounted on a suitable mounting board 70 as shown in the drawing. The support of the mounting board with the components thereon is effected by providing channels 66 integral with the interior walls of the cover on either side thereof so that the mounting board can be slid into the channels for support thereby. The necessary wires 74 for connecting the electronic module with other circuitry are passed through the opening of the cover to be connected to a conventional pin-type plug.

A bottom plate or floor 80 of the same dimensions as the cross section of the cover is provided for being sealed to the bottom of the cover opening. The bottom cover or lid defines a generally circular opening 82 which defines the same flanges and shoulders and annular interior surface portions as opening 34 in cover 30. The wires 74 are passed through opening 82 prior to the lid being sealed to the cover, which wires are also inserted in the holes in a conventional plug 10 and soldered to the appropriate solder pins thereof. Lid 80 is then positioned over the opening 63 of the cover and sealed into place by any suitable means, such as by gluing with an epoxy or other suitable adhesive, by heating the cover and lid and forming a bond therebetween, or in any other suitable manner. Wires 74 are then pushed back up into the cover through opening 82, and the plug is snapped into place in the circular opening 82.

A side elevational view, partly in section, of the enclosure shown in FIGURE 4 is shown in FIGURE 5 with lid 80 sealed to cover 60 and the plug snapped into place. The circuit board 70 is also shown supported on either side by channel 66 on one interior wall of the enclosure and channel 66' on the opposite interior wall. As is more clearly shown in this view, circular opening 82 defines the same flanges and shoulders as earlier described for forming a seal with a conventional plug. Thus when the plug is forced into the opening of cover 80, there is a vertical wall section or interior surface portion 85 which bears against the sides of the lower section 14 of the plug, which wall section forms a shoulder 84 with another wall section 87 and the latter of which bears against the sides of section 18 of the plug. Shoulder 84 comes to rest against the top of section 14 to limit the forward position of the plug into the opening. A beveled flange 86 is provided adjacent wall section 87 which is deflected and urged over the top section 12 of the plug when the plug is forced into the opening, with flange 86 coming into correspondence with intermediate section 16 of the plug and cooperating with the shoulder formed between the intermediate and top sections of the plug to lock the plug into place. An upper wall section or interior surface portion 88 of substantially the same diameter as the top section 12 of the plug bears agaianst the sides of the top section to form an effective seal between the plug and the enclosure.

It will now be readily apparent that the dimensions and shape of the enclosure can be varied as desired to handle smaller or large groups of components to complete a module, with the circular opening in the enclosure and the flanges described remaining constant to conform and match the conventional tube plug. Thus many modifications and substitutions are possible, and it is therefore intended that the scope of the invention be limited only as defined in the appended claims.

What is claimed is:

1. An electrical component assembly module comprising:

(a) a pin-type plug of generally circular cross section defining a plurality of consecutive sections of multiple diameters with an intermediate section having a diameter less than an upper section, (b) electrical component means mounted on top of said plug and electrically connected to pins thereof, (c) a hollow member enclosed on one end defining a generally circular opening in the other end thereof disposed at said open end about the sides of said plug, and (d) a plurality of consecutive, resilient, annular interior surface portions of said hollow member adjacent said open end having diameters substantially corresponding to said multiple diameters, respectively, of said plurality of consecutive sections of said plug, (e) whereby said plurality of annular interior surface portions are urged into coincidence with said plurality of sections, respectively, when said plug is forced into said opening of said hollow member.

2. An electrical component assembly module according to claim 1 wherein said hollow member includes at least one flange adapted to lock said plug within said opening at said hollow member.

3. An electrical component assembly module according to claim 2 wherein said interior surface portions bear against the sides of said plug to form an effective sealed enclosure.

4. An electrical component assembly module, comprising:

(a) a pin-type plug of generally circular cross section defining a plurality of consecutive sections of multiple diameters, (b) a hollow member enclosed at one end and open at the other end, (c) a board having circuit components mounted thereupon within said hollow member, said circuit components being selectively electrically connected with pins of said plug, (d) a cover defining a generally circular opening therein secured to said hollow member for closing of said open end of said hollow member, and (e) a plurality of consecutive, resilient, annular surface portions provided on the interior surface of said circular opening, said surface portions having diameters substantially corresponding to said multiple diameter, respectively, of said plurality of consecutive sections.

References Cited

UNITED STATES PATENTS

| | | | |
|---|---|---|---|
| 2,580,762 | 1/1952 | Grenier et al. | 220—60 X |
| 3,022,922 | 2/1962 | Patton et al. | 220—60 X |
| 3,272,908 | 9/1966 | Beecher | 174—52 |

FOREIGN PATENTS

| | | |
|---|---|---|
| 1,051,033 | 7/1963 | Great Britain. |

LEWIS H. MYERS, *Primary Examiner.*

D. A. TONE, *Assistant Examiner.*

U.S. Cl. X.R.

220—60